(12) United States Patent
Fujio

(10) Patent No.: US 6,670,106 B2
(45) Date of Patent: Dec. 30, 2003

(54) FORMATION METHOD OF PATTERN

(75) Inventor: Masayuki Fujio, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/799,113

(22) Filed: Mar. 6, 2001

(65) Prior Publication Data

US 2001/0033998 A1 Oct. 25, 2001

(30) Foreign Application Priority Data

Mar. 21, 2000 (JP) ........................................ 2000-078406

(51) Int. Cl.$^7$ ................................................. G03F 7/00
(52) U.S. Cl. ........................ 430/322; 430/312; 430/324
(58) Field of Search ................................ 430/312, 322, 430/324

(56) References Cited

U.S. PATENT DOCUMENTS

| | | | | |
|---|---|---|---|---|
| 4,578,859 A | * | 4/1986 | Hause et al. | 438/942 |
| 5,756,256 A | * | 5/1998 | Nakato et al. | 430/160 |
| 6,221,562 B1 | * | 4/2001 | Boyd et al. | 430/323 |
| 6,277,544 B1 | * | 8/2001 | Singh et al. | 430/313 |
| 2001/0056144 A1 | * | 12/2001 | Lamb et al. | 524/377 |

FOREIGN PATENT DOCUMENTS

| | | |
|---|---|---|
| JP | 61-70723 | 4/1986 |
| JP | 9-190959 | 7/1997 |

* cited by examiner

*Primary Examiner*—Mark F. Huff
*Assistant Examiner*—Kripa Sagar
(74) *Attorney, Agent, or Firm*—Nixon & Vanderhye P.C.

(57) ABSTRACT

A pattern formation method includes: forming a photoresist layer of a positive type on a substrate; exposing to light and developing the photoresist layer using an inversion mask having an opening at a site where a pattern is desired to be formed finally, thereby forming an opening portion in the photoresist layer to expose the substrate; applying a non-photosensitive organic film on an entire surface of the resulting substrate, so that the non-photosensitive organic film is embedded in the opening portion; etching back an entire surface of the non-photosensitive organic film on the photoresist layer until the photoresist layer is exposed; and exposing to light and developing an entire surface of the photoresist layer to remove the photoresist layer, thereby obtaining the non-photosensitive organic film having the desired pattern.

10 Claims, 3 Drawing Sheets

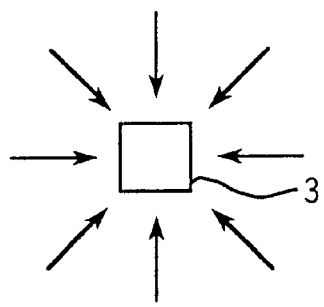
Fig.4(a-1)
prior art
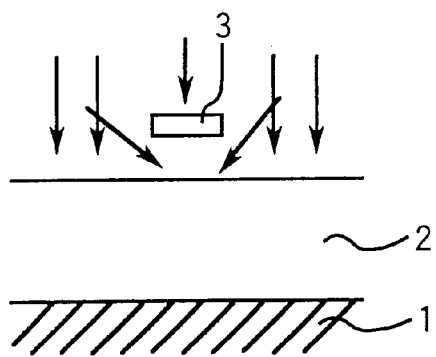
Fig.4(a-2)
prior art
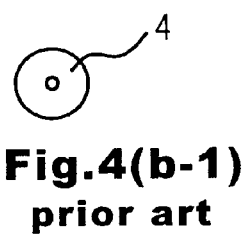
Fig.4(b-1)
prior art
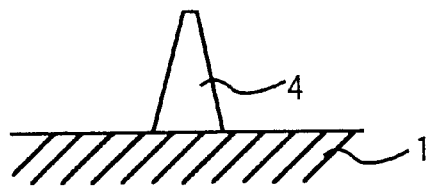
Fig.4(b-2)
prior art

FORMATION METHOD OF PATTERN

CROSS-REFERENCE TO RELATED APPLICATION

This application is related to Japanese application No. HEI 12(2000)-078406 filed on Mar. 21, 2000, whose priority is claimed under 35 USC §119, the disclosure of which is incorporated by reference in its entirety.

BACKGROUND OF THE INVENTION

1. Field of the Invention

The present invention relates to a formation method of a pattern, and more particularly to a formation method of a precise pattern in a good configuration.

2. Description of Related Art

As semiconductor devices are more highly integrated and developed higher performance, there is an increasing demand for precise patterns for formation of wirings or the like and it is becoming important to form patterns of high precision through a photolithography technique. With reference to FIGS. 2(a) to 2(c), a formation method of a pattern on a semiconductor substrate through a conventional photolithography technique will be explained.

First, as shown in FIG. 2(a), a photoresist layer 2 is formed on a semiconductor substrate 1 by a coating method. Next, as shown in FIG. 2(b), the photoresist layer 2 is exposed to exposure light such as ultraviolet light and an electron beam (EB) via a mask 3 to form an image of a desired pattern on the photoresist layer 2. Subsequently, the photoresist layer 2 is developed with a developer such as an alkaline aqueous solution to partially dissolve and partially make remain the photoresist layer 2. Thus, a pattern 4 made of a resist is formed.

Here, a resist of which an exposed portion is dissolved by development is referred to as a positive resist whereas a resist of which the exposed portion is made to remain by development is referred to as a negative resist. In photolithography techniques using wavelengths of a g-beam and an i-beam, normally used is the positive resist because of its good performance (concerning resolution, depth of focus and the like).

Further, a formation method of a resist pattern with a higher resolution is disclosed in Japanese Unexamined Patent Publication No. HEI 9(1997)-190959. This method is intended to form a narrow space pattern or a contact hole pattern, utilizing the dependence of resolution of the resist pattern on a configuration of the pattern itself.

The method disclosed in the above-mentioned publication will be briefly explained with reference to FIGS. 3(a) to 3(c).

First, on a semiconductor substrate 11 is formed a pattern such as a densely formed trace pattern, an isolated trace pattern or a pillar pattern having a comparatively high resolution. In FIG. 3(a), a pillar pattern 12 is formed as an example of the pattern. The formation of the above pattern utilizes the fact that a pattern such as the densely formed trace pattern, the isolated trace pattern or the pillar pattern in which a portion remaining after the development forms a pattern shows a higher resolution than a pattern such as a contact hole pattern or an isolated-space pattern in which a portion dissolved after the development forms a pattern. Subsequently, as shown in FIG. 3(b), a negative photoresist layer 13 is formed on the entire surface of the substrate. Then, only the pillar pattern 12 is removed by whole light exposure and development. Thus, a hole pattern 14 can be obtained finally as shown in FIG. 3(c).

In order to realize scale reduction of semiconductor devices, it is required to improve the resolution of a resist layer and set various conditions in the formation of a pattern for enlarging clearance for defocus (depth of focus).

A pillar pattern employed mainly as a mask for ion implantation is especially required to be formed with high precision because its configuration is greatly influential in characteristics of transistors. As scale reduction of semiconductor devices is progressing, it is becoming necessary to control the configuration of a resist pattern precisely.

In the cases where a pattern such as the pillar pattern is formed using the positive resist as employed in the above-mentioned conventional art, after the developing, the pattern is liable to have a gently-sloping mountain-like taper as shown in FIGS. 4(b-1) and (b-2) under the influence of light diffracted from the outside of the mask 3 at the exposure to light as shown in FIGS. 4(a-1) and 4(a-2).

As mentioned in the above publication, indeed the pillar pattern offers a relatively higher resolution than the hole pattern. However, the difference in resolution between the pillar and hole patterns is only 0.05 µm in the case of a design rule of 0.35 µm using exposure light of an i-beam and a positive resist. As to the clearance for defocus (depth of focus), that for the formation of the pillar pattern is extremely smaller than that for the formation of the hole pattern (see Table 1). This phenomenon becomes more apparent as intended pattern dimension becomes more minute, and it is difficult to form the pillar pattern while keeping a stable depth of focus when the pattern dimension is on the order of a quarter micron or less. In Table 1, the depth of focus means the range of focus in which a pattern is in error of ±0.05 µm and is free from defects (failure in opening configuration, short circuit, break of wirings, loss of resist film height or the like).

TABLE 1

| | Patterns | | | | | |
| --- | --- | --- | --- | --- | --- | --- |
| | Lines or the like | | | Contact holes, spaces or the like | | |
| | Densely formed trace pattern | Isolated trace pattern | Pillar pattern | Isolated space pattern | Isolated hole pattern | Densely formed hole pattern |
| Resolution after development | 0.35 | 0.35 | 0.35 | 0.40 | 0.40 | 0.40 |
| Depth of focus (µm) at pattern dimension of 0.4 µm | 1.0 | 0.8 | 0.2 | 0.8 | 0.8 | 0.8 |
| Pattern dimension at depth of focus of 1.0 µm or more | 0.40 | 0.45 | 0.80 | 0.45 | 0.45 | 0.45 |

SUMMARY OF THE INVENTION

The present invention provides a first formation method of a pattern comprising the steps of: forming a photoresist layer of a positive type on a substrate; exposing to light and developing the photoresist layer using an inversion mask having an opening at a site at which a pattern is desired to be formed finally, thereby forming an opening portion in the photoresist layer to expose the substrate at the site; applying a non-photosensitive organic film on an entire surface of the substrate including the photoresist layer, so that the non-photosensitive organic film is embedded in the opening portion; etching back an entire surface of the non-photosensitive organic film on the photoresist layer until the photoresist layer is exposed; and exposing to light and developing an entire surface of the photoresist layer to remove the photoresist layer, thereby obtaining the non-photosensitive organic film having the desired pattern.

Further, the present invention provides a second formation method of a pattern comprising the steps of: forming a first photoresist layer of a positive type on a substrate; performing a first exposure to light and development by exposure light having a predetermined wavelength using a inversion mask having an opening at a site at which a pattern is desired to be formed finally, thereby forming an opening portion in the first photoresist layer to expose the substrate at the site; applying a second photoresist layer on an entire surface of the substrate including the first photoresist layer, so that the second photoresist layer is embedded in the opening portion; etching back an entire surface of the second photoresist layer on the first photoresist layer until the first photoresist layer is exposed; and exposing to light and developing an entire surface of the first photoresist layer and an entire surface of the second photoresist layer by exposure light having the same wavelength as that of the exposure light used in the formation of the opening portion, to remove the first photosensitive layer, thereby obtaining the second photoresist layer with the desired pattern.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 2(a) to 1(c) are schematic sectional views for explaining a conventional formation method of a pattern;

FIGS. 4(a-1), 4(a-2), 4(b-1) and 4(b-2) are views for explaining a problem concerning a conventional formation method of a pattern.

DESCRIPTION OF THE PREFERRED EMBODIMENTS

Figure 1A:
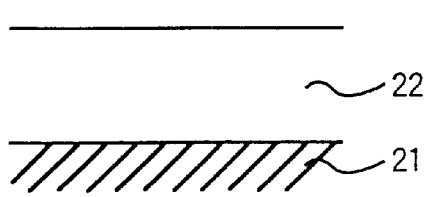
FIGS. 1(a) to 1(f) are schematic sectional views for explaining a formation method of a pattern according to the present invention.

The first formation method of the present invention will be explained hereafter.

First, a photoresist layer of a positive type is formed on a substrate.

The substrate usable in the present invention is not particularly limited, and any substrate on which a pattern is intended to be formed can be used. The substrate may be specifically a semiconductor substrate, a glass substrate, a resin substrate or the like.

The positive photoresist layer can be formed of a photoresist material of a positive type normally used in the art. The photoresist layer preferably has a thickness of 0.5 $\mu$m to 1.5 $\mu$m. The photoresist layer may be formed by rotationally applying a solution containing the photoresist material on the substrate. The photoresist layer obtained by this method is preferably prebaked at a predetermined temperature.

Next, the photoresist layer is exposed to light and developed using an inversion mask having an opening at a site at which a pattern is desired to be formed finally, so that an opening portion is formed in the photoresist layer to expose the substrate at the site.

The mask usable in the above-mentioned step may be a glass mask with a chrome shielding plate, a phase shift mask of a halftone type or the like. When the halftone type phase shift mask is used, the depth of focus is enlarged and a pattern in a good configuration can be formed, owing to the effect (improved resolution) of the phase shift mask and the effect (improved depth of focus) of the present invention.

A light source for the exposure is not particularly limited, and ultraviolet light, an i-beam, a g-beam, a KrF beam, an ArF beam, an EB beam or the like can be used. The photoresist layer is preferably baked after the exposure. A developer to be used for the development is suitably selected depending on a material of the photoresist layer. Normally, an alkaline aqueous solution is used as the developer.

By the exposure and development as mentioned above, the opening portion is formed in the photoresist layer at the site at which the pattern is desired to be formed finally. The configuration of the opening portion is not particularly limited, and a desired configuration can be imparted depending on applications of the pattern. In the field of semiconductor devices for example, the opening portion may be in a pillar pattern, a densely formed trace pattern, an isolated trace pattern or the like pattern.

The photoresist layer is preferably post-baked in order to remove water therefrom after developing.

Next, the non-photosensitive organic film is formed on the entire surface of the substrate including the photoresist layer, so that the non-photosensitive organic film is embedded in the opening portion.

The non-photosensitive organic film can be formed by rotationally applying a solution containing an organic material comprised of a resin, a solvent, a crosslinking agent and the like. The non-photosensitive organic film is applied on the substrate preferably under such conditions that the film thickness is 0.05 $\mu$m to 0.5 $\mu$m on a flat substrate. In the cases where the non-photosensitive organic film is formed by application, most of the non-photosensitive organic film is embedded in the opening portion, and there is hardly any non-photosensitive organic film on the photosensitive layer.

Subsequently, the non-photosensitive organic film is preferably baked. The baking temperature and time are not particularly limited so far as they are such that a photosensitive material remaining in the photoresist layer does not fly away because of its sublimation or the like, thermal curing reaction and crosslinkage sufficiently take place in the non-photosensitive organic film, and the resins of the photoresist layer and the non-photosensitive organic film do not thermally flow to be mixed together. In other words, the baking temperature and time can be set as required so far as the resins of the photoresist layer and the non-photosensitive organic film do not fuse together.

Thereafter, the entire surface of the non-photosensitive organic film on the photoresist layer is etched back until the photoresist layer is exposed. This etch back can be performed by use of oxygen plasma, for example. By the etch back, the thickness of the non-photosensitive organic film in the opening portion is reduced by 30% in the depth direction.

Thereafter the entire surface of the photoresist layer is exposed to light and developed to remove the photoresist layer, and thereby the non-photosensitive organic film having the desired pattern is obtained. The conditions for the exposure and development can be the same as in the formation of the opening portion.

Next, the second formation method of the present invention will be explained hereafter.

The second formation method is basically the same as the first formation method except that instead of the non-photosensitive organic film, a photosensitive resin layer (known photoresist layer) is used as a resin layer (second photoresist layer) to be embedded in the opening portion formed in a first photoresist layer. In this case, the second photoresist layer is preferably formed of a resin that has a high absorbance with respect to a wavelength of exposure light applied in the second exposure to light and does not transmit exposure light.

For example, a photoresist containing as a base resin a novolak resin, a typical resin in use for a photolithography process using an i-beam has a high absorption to light from a KrF excimer laser (a wavelength $\lambda$ of 248 nm) and has a transmission as low as around 5% to the light.

On the other hand, a photoresist containing as a base resin polyhydroxystyrene (PHS resin) for use in the KrF excimer laser has a high absorption to light from an ArF excimer laser (a wavelength of $\lambda$ of 193 nm) and hardly transmits the light.

This means that by adjusting the wavelength of exposure light in the second exposure to make the second photoresist layer remain after the development, it becomes possible to underexpose the inside of the second photoresist layer to a great extent. The second photoresist layer also serves as an anti-reflection film.

More specifically, in the case of exposure light of a wavelength of 248 nm, the second photoresist layer to be embedded in the opening portion may be a photoresist layer for use in application of the i-beam, containing the novolak resin as a base resin. In the case of exposure light of a wavelength of 193 nm, the second photoresist layer may be a photoresist layer for use in application of light from the KrF excimer laser, containing polyhydroxystyrene as a base resin.

Preferably, the second photoresist layer is formed by rotational application and subsequently baked. It is desirable to suitably set the baking temperature and time such that resins of the first photoresist layer and the second photoresist layer do not fuse together.

EXAMPLE

The present invention will now be explained in detail based on the preferred example shown in the drawings. It should be understood that the present invention is not limited to the example.

The example of the present invention will be explained with reference to FIGS. 1(a) to 1(f).

First, as shown in FIG. 1(a), a photoresist layer 22 of a positive type was formed by rotationally applying a photoresist material (PFI-38A9 containing a novolak resin as a base resin; manufactured by Sumitomo Chemical Co., Ltd.) to a thickness of about 1.0 $\mu$m on a semiconductor substrate 21 at 2500 rpm and was prebaked at 90° C. for 60 seconds.

Figure 1B:
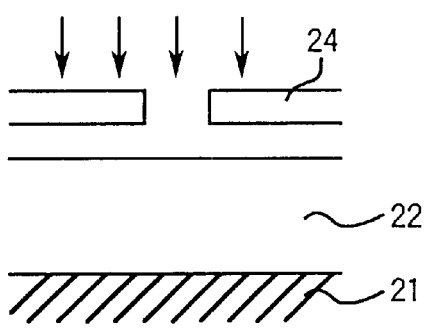
Figure 1C:
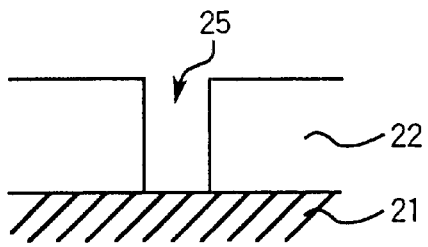

Next, as shown in FIG. 1(b), the photoresist layer 22 was exposed to light by a reduction projection step and repeat exposure system (stepper) by applying an i-beam (a wavelength of 365 nm) using a glass mask 24 with a chrome shielding plate as an inversion mask having an opening at a site at which a pillar pattern was desired to be formed.

After the exposure, the photoresist layer 22 was baked (PEB) at 100° C. for 60 seconds and developed with an alkaline aqueous solution (NMD-W; manufactured by Tokyo Ohka Kogyo Co., Ltd.). This allowed an opening portion 25 to be formed at the site at which the pillar pattern is desired to be formed (see FIG. 1(c)). Subsequently, the photoresist layer 22 was post-baked at 110° C. for 60 seconds in order to remove water remaining in the photoresist layer 22. The depth of focus of the opening portion 25 was larger than that of the pillar pattern desired to be formed. Also, the opening portion 25 had a good configuration with a small taper (i.e., a configuration close to a rectangle).

Figure 1D:
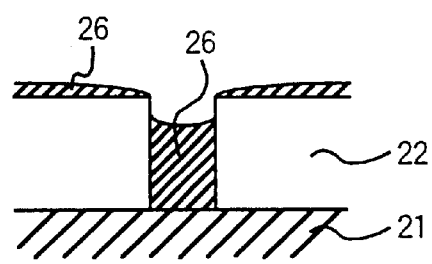

Next, as shown in FIG. 1(d), a non-photosensitive organic film 26 was formed on the entire surface of the semiconductor substrate 21 including the photoresist layer 22 by rotational coating at 1500 rpm under such conditions that the film thickness became about 0.2 $\mu$m on a flat substrate. A material for the non-photosensitive organic film 26 was XHRI-11 (manufactured by Brewer Science Co.) capable of forming an anti-reflection film. Since the opening portion had a depth as large as about 0.9 $\mu$m or more, most of the material for forming the non-photosensitive organic film 26 flowed into the opening portion and almost no non-photosensitive organic film 26 was formed on the photoresist layer 22. Specifically, the non-photosensitive layer 22 has a thickness of about 0.7 $\mu$m within the opening portion 25 and about 0.02 $\mu$m on the photoresist layer 22. Thereafter, the non-photosensitive film 26 was baked at 100° C. for 60 seconds.

Figure 1E:
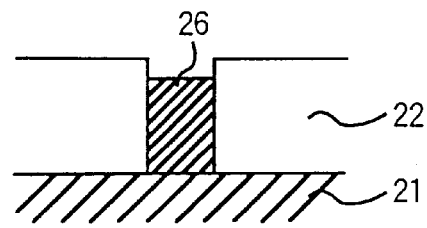

Next, as shown in FIG. 1(e), the entire surface of the non-photosensitive organic film 26 on the photoresist layer 22 was etched back using oxygen plasma until the photoresist layer 22 was exposed. The etch back reduced the thickness of the non-photosensitive organic film within the opening portion to about 0.6 $\mu$m.

Figure 1F:
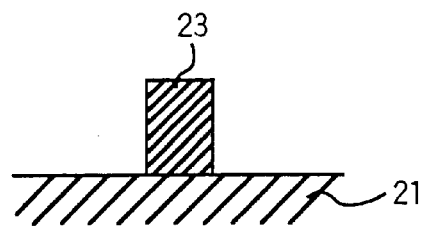
Figure 2A:
Figure 2B:
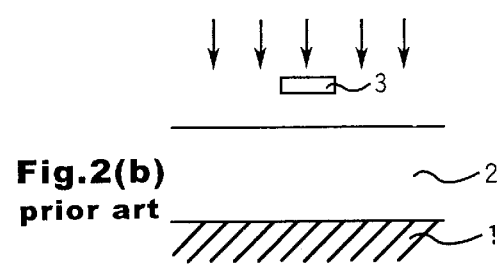
Figure 2C:
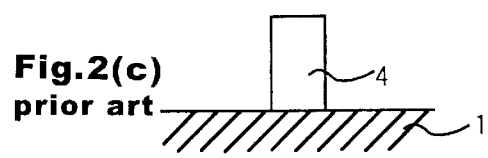
Figure 3A:
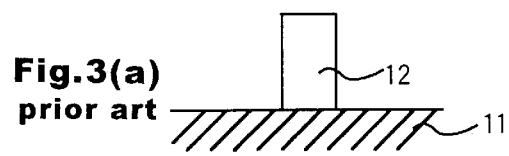
FIGS. 3(a) to 3(c) are schematic sectional views for explaining a conventional formation method of a pattern.
Figure 3B:
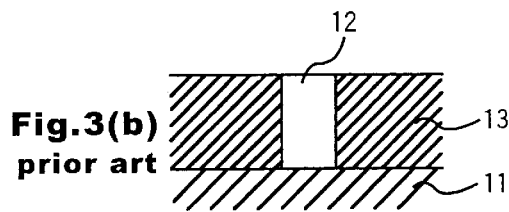
Figure 3C:
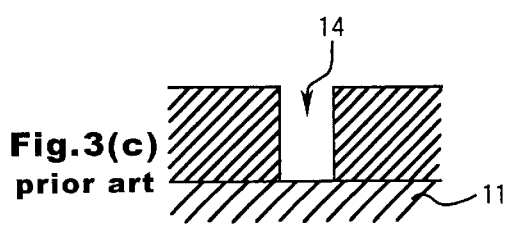

Then, the entire surface of the photoresist layer 22 was exposed to light by the reduction projection step and repeat exposure system (stepper) by applying the i-beam (the wavelength of 365 nm) without using a mask. Thereafter, the photoresist layer 22 was developed with an alkaline aqueous solution to be removed by dissolution as a whole, and thereby a pillar pattern was formed of the remaining non-photosensitive organic film 26, as shown in FIG. 1(f).

According to the above-mentioned example, a contact hole is formed by a photolithography technique, so that the depth of focus is improved and the pillar pattern in a good configuration can be formed.

According to the present invention, in formation of a pattern, which has been formed with use of photoresist layers alone, one of the photoresist layers is exchanged with an organic film not sensitive to the wavelength of exposure light. By this exchange, a sufficiently large depth of focus is obtained and a precise pattern in a good configuration can be formed which has a higher aspect ratio than that of a conventional one. Using this pattern as an etching mask, an implantation blocking mask or the like enables formation of a highly sophisticated semiconductor device because of high precision of the pattern as a mask.

What is claimed is:

1. A formation method of a pattern for use as an etching mask or ion-injection mask, the method comprising:

forming a photoresist layer of a positive type on a substrate;

exposing and developing the photoresist layer using an inversion mask having an opening at a site at which a pattern is desired to be formed, thereby forming an opening portion in the photoresist layer to expose the substrate at the site;

applying a non-photosensitive organic film on an entire surface of the substrate including the photoresist layer, so that the non-photosensitive organic film is embedded in the opening portion, wherein the non-photosensitive organic film embedded in the opening portion absorbs exposure light which can expose the photoresist layer;

wherein the non-photosensitive organic film comprises a polymer compound film including a light absorbing material and is used as an anti-reflection film;

etching back an entire surface of the non-photosensitive organic film on the photoresist layer until the photoresist layer is exposed; and exposing to light and developing an entire surface of the photoresist layer to remove the photoresist layer, thereby obtaining the non-photosensitive organic film having the desired pattern for the mask.

2. A formation method as set forth in claim 1, wherein the pattern desired to be formed of the non-photosensitive organic film is a pillar pattern.

3. A formation method as set forth in claim 1, wherein the inversion mask is a phase shift mask.

4. A formation method as set forth in claim 1, wherein the photoresist layer is exposed by applying at least one of an i-line beam, a KrF beam, an ArF beam and an EB to the photoresist layer.

5. A formation method of a pattern comprising:

forming a first photoresist layer of a positive type on a substrate;

performing a first exposure to light and development by exposure light having a predetermined wavelength using a inversion mask having an opening at a site at which a pattern is desired to be formed finally, thereby forming an opening portion in the first photoresist layer to expose the substrate at the site;

applying a second photoresist layer, formed of a material which absorbs exposure light for the first exposure, on an entire surface of the substrate including the first photoresist layer, so that the second photoresist layer is embedded in the opening portion but does not fill the opening portion;

etching back an entire surface of the second photoresist layer on the first photoresist layer until the first photoresist layer is exposed; and exposing to light and developing an entire surface of the first photoresist layer and an entire surface of the second photoresist layer by exposure light having the same wavelength as that of the exposure light used in the formation of the opening portion, to remove the first photosensitive layer, thereby obtaining the second photoresist layer with the desired pattern.

6. A formation method as set forth in claim 5, wherein the first photoresist layer contains polyhydroxystyrene as a base resin, the second photoresist layer contains a novolak resin as a base resin, and the exposure light is light having a wavelength of 248 nm.

7. A formation method as set forth in claim 5, wherein the first photoresist layer contains polymethacrylic acid as a base resin, the second photoresist layer contains polyhydroxystyrene as a base resin, and the exposure light is light having a wavelength of 193 nm.

8. The method of claim 5, wherein the opening portion in the first photoresist layer has a width less than a width of the remaining first photoresist layer after the opening portion in the first photoresist layer is formed.

9. The method of claim 5, wherein in said performing of the first exposure to light to form an opening portion in the first photoresist layer to expose the substrate at the site, the first photoresist layer but not the second photoresist layer is exposed to the light.

10. A formation method of a pattern, the method comprising:

forming a photoresist layer of a positive type on a substrate;

exposing and developing the photoresist layer using an inversion mask having an opening at a site at which a pattern is desired to be formed, thereby forming an opening portion in the photoresist layer to expose the substrate at the site;

applying a non-photosensitive organic film, formed of a material that absorbs light which can expose the photoresist layer, on a surface of the substrate including the photoresist layer, so that the non-photosensitive organic film is embedded in the opening portion but does not completely fill the opening portion;

etching back a surface of the non-photosensitive organic film on the photoresist layer until the photoresist layer is exposed;

exposing to light and developing a surface of the photoresist layer to remove the photoresist layer, thereby obtaining the non-photosensitive organic film having the desired pattern; and wherein the non-photosensitive organic film comprises a polymer compound film including a light absorbing material and is used as an anti-reflection film.

* * * * *